United States Patent
Chen et al.

(10) Patent No.: US 11,929,109 B2
(45) Date of Patent: Mar. 12, 2024

(54) SUB-WORD LINE DRIVER PLACEMENT FOR MEMORY DEVICE

(71) Applicant: Taiwan Semiconductor Manufacturing Company, Ltd., Hsinchu (TW)

(72) Inventors: Yi-Tzu Chen, Hsinchu (TW); Ching-Wei Wu, Caotun Town (TW); Hau-Tai Shieh, Hsinchu (TW); Hung-Jen Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/306,762

(22) Filed: Apr. 25, 2023

(65) Prior Publication Data

US 2023/0267989 A1 Aug. 24, 2023

Related U.S. Application Data

(63) Continuation of application No. 17/687,272, filed on Mar. 4, 2022, now Pat. No. 11,670,362, which is a
(Continued)

(51) Int. Cl.
*G11C 11/40* (2006.01)
*G11C 5/02* (2006.01)
(Continued)

(52) U.S. Cl.
CPC .......... *G11C 11/4085* (2013.01); *G11C 5/025* (2013.01); *G11C 5/06* (2013.01); *G11C 11/4093* (2013.01)

(58) Field of Classification Search
CPC ....... G11C 11/4085; G11C 5/025; G11C 5/06; G11C 7/1039
See application file for complete search history.

(56) References Cited

U.S. PATENT DOCUMENTS 5,848,006 A * 12/1998 Nagata ..................... G11C 8/12
365/189.08
8,106,441 B2   1/2012 Akiyama et al.
(Continued)

OTHER PUBLICATIONS

Notice of Allowance on U.S. Appl. No. 17/687,272 dated Jan. 31, 2023.
(Continued)

*Primary Examiner* — Han Yang
(74) *Attorney, Agent, or Firm* — FOLEY & LARDNER LLP

(57) ABSTRACT

Disclosed herein are related to a memory system including unit storage circuits. In one aspect, each of the unit storage circuits abuts an adjacent one of the unit storage circuits. In one aspect, each of the unit storage circuits includes a first group of memory cells, a second group of memory cells, a first sub-word line driver to apply a first control signal to the first group of memory cells through a first sub-word line extending along a direction, and a second sub-word line driver to apply a second control signal to the second group of memory cells through a second sub-word line extending along the direction. In one aspect, the memory system includes a common word line driver abutting one of the unit storage circuits and configured to apply a common control signal to the unit storage circuits through a word line extending along the direction.

20 Claims, 5 Drawing Sheets

Related U.S. Application Data continuation of application No. 17/081,799, filed on Oct. 27, 2020, now Pat. No. 11,361,812.

(51) Int. Cl.
  *G11C 5/06* (2006.01)
  *G11C 11/408* (2006.01)
  *G11C 11/4093* (2006.01)

(56) References Cited

U.S. PATENT DOCUMENTS

| | | | |
|---|---|---|---|
| 8,151,173 | B2 | 4/2012 | Hirose et al. |
| 8,848,457 | B2 | 9/2014 | Takizawa |
| 9,646,688 | B2 | 5/2017 | Scheuerlein |
| 2006/0092750 | A1 | 5/2006 | Jeon et al. |
| 2008/0112209 | A1 | 5/2008 | Cho et al. |
| 2009/0116304 | A1 | 5/2009 | Kim et al. |
| 2013/0201770 | A1 | 8/2013 | Harris et al. |
| 2015/0135040 | A1 | 5/2015 | Lee et al. |
| 2016/0155484 | A1 | 6/2016 | Lin et al. |
| 2019/0206471 | A1 | 7/2019 | Berger et al. |
| 2019/0333769 | A1 | 10/2019 | Chen et al. |

OTHER PUBLICATIONS

Notice of Allowance on U.S. Appl. No. 17/081,799 dated Apr. 6, 2022 (9 pages).

Taiwan Office Action on TW Patent Appl. No. 110101020 dated Mar. 2, 2022 (5 pages).

Taiwan Office Action on TW Patent Appl. No. 110104295 dated Sep. 2, 2021 (3 pages).

U.S. Notice of Allowance on U.S. Appl. No. 17/081,799 dated Dec. 6, 2021 (10 pages).

U.S. Office Action on U.S. Appl. No. 17/081,799 dated Jul. 8, 2021 (16 pages).

\* cited by examiner

SUB-WORD LINE DRIVER PLACEMENT FOR MEMORY DEVICE

CROSS-REFERENCE TO RELATED APPLICATION

This application is a Continuation of U.S. patent application Ser. No. 17/687,272, filed Mar. 4, 2022, which is a Continuation of U.S. patent application Ser. No. 17/081,799, filed Oct. 27, 2020 (now U.S. Pat. No. 11,361,812), the entire contents of both of which are incorporated herein by reference for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
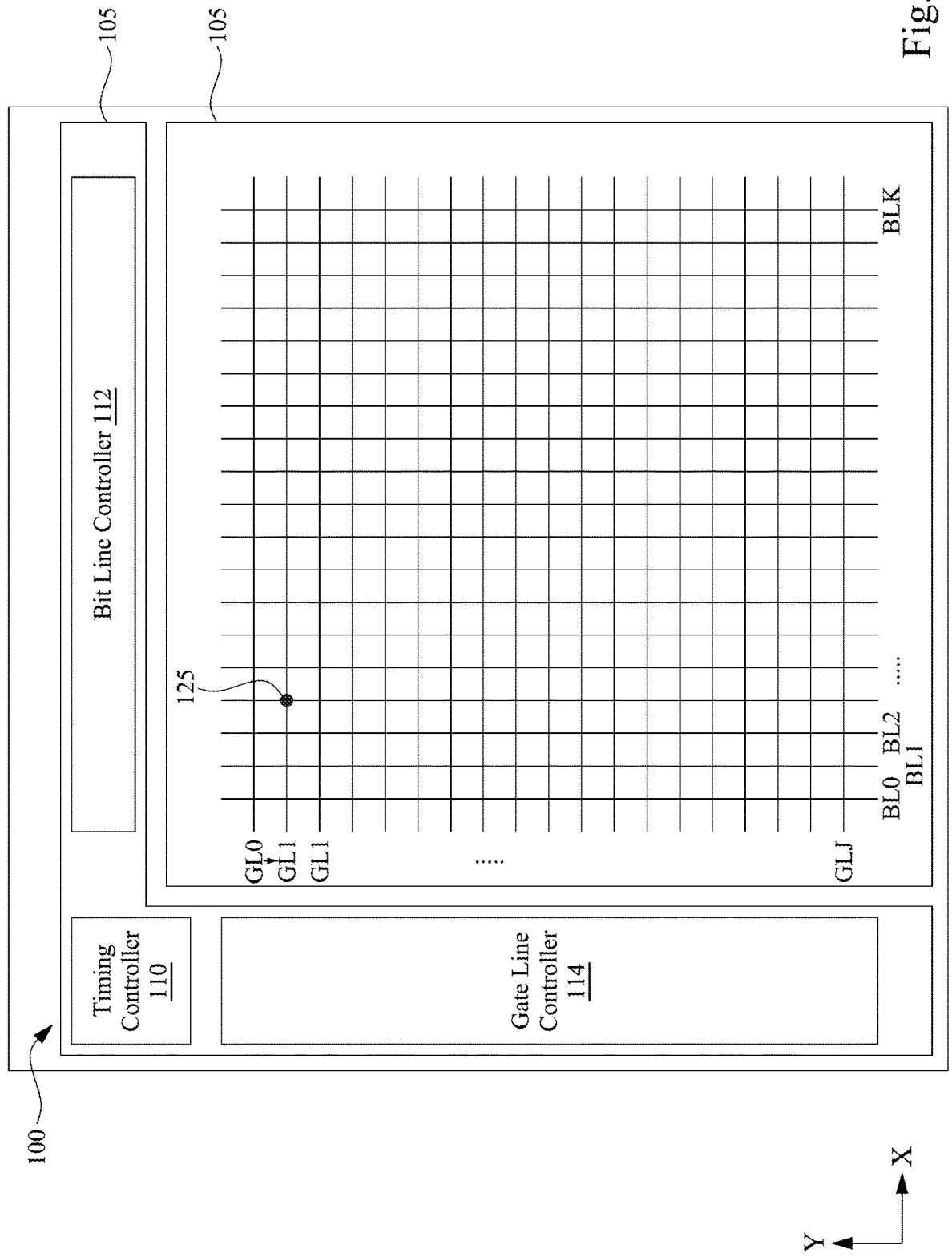
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a memory system including unit storage circuits. In one aspect, each of the unit storage circuits abuts an adjacent one of the unit storage circuits. In one aspect, each of the unit storage circuits includes a first group of memory cells, a second group of memory cells, a first sub-word line driver, and a second sub-word line driver. The first sub-word line driver may apply a first control signal to the first group of memory cells through a first sub-word line extending along a direction. The second sub-word line driver may apply a second control signal to the second group of memory cells through a second sub-word line extending along the direction. Each sub-word line driver may include a protection circuit to protect a corresponding group of memory cells. In one aspect, the memory system includes a common word line driver abutting one of the unit storage circuits and configured to apply a common control signal to the unit storage circuits through a common word line extending along the direction.

Advantageously, the memory system can achieve several benefits. In one aspect, the disclosed memory system implements the unit's storage circuits including a pair of sub-word line drivers and a pair of groups of memory cells between the pair of sub-word line drivers. Accordingly, a first group of memory cells closest to the common word line driver can be protected by a first sub-word line driver, such that an additional protection circuit may be omitted. Moreover, a last group of memory cells farthest away from the common word line driver can be protected by a last sub-word line driver, such that an additional protection circuit may be omitted. By omitting the additional protection circuits to protect the first group of memory cells and the last group of memory cells, an area efficiency can be achieved. Moreover, a length of the common word line can be reduced, such that RC loading at the common word line can be reduced to improve operating speed of the plurality of memory cells.

FIG. 1 is a diagram of a memory system 100, in accordance with one embodiment. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL (or a word line WL) and a corresponding bit line BL. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of memory cells 125. The memory array 120 includes gate lines GL0, GL1 . . . GLJ, each extending in a first direction (e.g., X-direction) and bit lines BL0, BL1

. . . BLK, each extending in a second direction (e.g., Y-direction). Each gate line includes a word line and one or more control lines. The gate lines GL and the bit lines BL may be conductive metals or conductive rails. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a ferroelectric field-effect transistor (FeFET), resistive memory cell, a non-volatile memory cell, or a volatile memory cell. In some embodiments, the memory array 120 includes additional lines (e.g., select lines, reference lines, reference control lines, power rails, etc.). Detailed descriptions on configurations and operations of the memory system 100 are provided below with respect to FIGS. 2 through 4.

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120, and the bit line controller 112 is a circuit that provides or senses a voltage or current through one or more bit lines BL and/or select lines SL of the memory array 120. In one configuration, the timing controller 110 is a circuit that provides control signals or clock signals to synchronize operations of the bit line controller 112 and the gate line controller 114. The bit line controller 112 may be connected to bit lines BL and/or select lines SL of the memory array 120, and the gate line controller 114 may be connected to gate lines GL of the memory array 120. In one example, to write data to a memory cell 125, the gate line controller 114 provides a voltage or current to the memory cell 125 through a gate line GL connected to the memory cell 125, and the bit line controller 112 applies a bias voltage to the memory cell 125 through a bit line BL and/or a select line SL connected to the memory cell 125. In one example, to read data from a memory cell 125, the gate line controller 114 provides a voltage or current to the memory cell 125 through a gate line GL connected to the memory cell 125, and the bit line controller 112 senses a voltage or current corresponding to data stored by the memory cell 125 through a bit line BL and/or a select line SL connected to the memory cell 125. In some embodiments, the memory controller 105 includes more, fewer, or different components than shown in FIG. 1.

Figure 2:
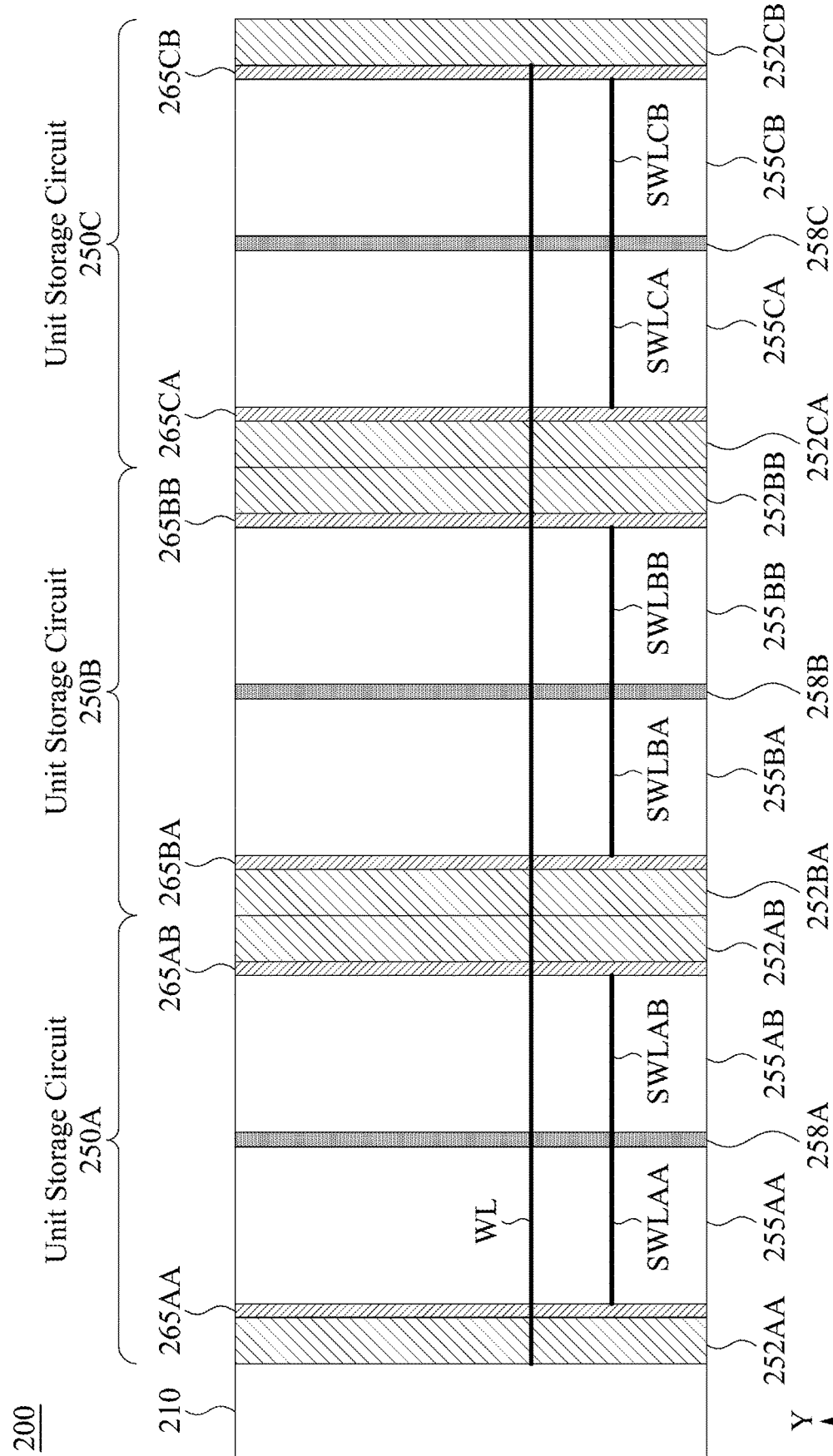
FIG. 2 is a diagram of a memory system including a common word line driver and a plurality of unit storage circuits, in accordance with one embodiment.

FIG. 2 is a diagram of a memory system 200 including a common word line driver 210 and a plurality of unit storage circuits 250A, 250B, 250C, in accordance with one embodiment. In some embodiments, the memory system 200 is or part of the memory system 100 of FIG. 1. Each of the plurality of unit storage circuits 250A, 250B, 250C includes a pair of sub-word line drivers 252 and a pair of memory arrays 255. In one aspect, the common word line driver 210 and sub-word line drivers 252AA, 252AB, 252BA, 252BB, 252CA, 252CB operate together as the gate line controller 114 of FIG. 1 to configure or operate the memory arrays 255. In some embodiments, the memory system 200 includes more, fewer, or different components than shown in FIG. 2.

In one configuration, the common word line driver 210 and the unit storage circuits 250A, 250B, 250C are disposed along the X-direction in that sequence. In one aspect, the common word line driver 210 abuts a first side of the unit storage circuit 250A, and a second side of the unit storage circuits 250A abuts a first side of the unit storage circuits 250B. In one aspect, a second side of the unit storage circuits 250B abuts a first side of the unit storage circuits 250C. In one configuration, a common word line WL may extend over the unit storage circuits 250A, 250B, 250C along the X-direction.

In some embodiments, the common word line driver 210 is a circuit or a hardware component that can provide a common control signal to memory arrays 255AA, 255AB, 255BA, 255BB, 255CA, 255CB. A common control signal may be a word line voltage or a word line pulse to configure or operate the memory arrays 255AA, 255AB, 255BA, 255BB, 255CA, 255CB. In one configuration, the common word line driver 210 is electrically coupled to the memory arrays 255AA, 255AB, 255BA, 255BB, 255CA, 255CB through the common word line WL. By applying the word line voltage or world line pulse to the memory arrays 255AA, 255AB, 255BA, 255BB, 255CA, 255CB through the common word line WL, the memory arrays 255AA, 255AB, 255BA, 255BB, 255CA, 255CB can store data or output stored data.

In some embodiments, each unit storage circuit 250X includes a pair of memory arrays 255XA, 255XB, and a pair of sub-word line drivers 252XA, 252XB. In one configuration, a sub-word line driver 252XA is disposed at a first side of the unit storage circuit 250X and a sub-word line driver 252XB is disposed at a second side of the unit storage circuit 250X. The memory arrays 255XA, 255XB may be disposed between the sub-word line drivers 252XA, 252XB, where the memory array 255XA may abut the sub-word line driver 252XA and the memory array 255XB may abut the sub-word line driver 252XB. Each memory array 255 may include a group of memory cells 125. In one aspect, the sub-word line driver 252XA may be electrically coupled to a first group of memory cells 125 in the memory array 255XA through a sub-word line SWLXA extending along the X-direction over the first group of memory cells 125. In one aspect, the sub-word line driver 252XB may be electrically coupled to a second group of memory cells 125 in the memory array 255XB through a sub-word line SWLXB extending along the X-direction over the second group of memory cells 125. In one aspect, each sub-word line SWL is shorter than the common word line WL. The unit storage circuit 250X may include a word line stub 258X between the memory arrays 255XA, 255XB to electrically decouple or separate the sub-word lines SWLXA, SWLXB. Through the sub-word lines SWLXA, SWLXB, the sub-word line drivers 252XA, 252XB can configure or operate the memory arrays 255XA, 255XB separately.

In one aspect, each sub-word line driver 252XA includes an interface circuit 265XA abutting the memory array 255XA. The interface circuit 265XA may include a logic conversion circuit that can receive a digital signal and apply an analog control signal corresponding to the digital signal to a group of memory cells 125 through the sub-word line SWLXA. The interface circuit 265XA may also include a protection circuit abutting a side of the memory array 255XA. The protection circuit may protect the group of memory cells 125 in the memory array 255XA.

Advantageously, the memory system 200 can achieve several benefits. In one aspect, the memory system 200 includes N number of memory array 255, N number of sub-word line drivers 252, and N/2 number of word line straps 258. In one aspect, the first memory array 255AA closest to the common word line driver 210 can be protected by the first sub-word line driver 252AA, such that an additional protection circuit to protect the first memory array 255AA may be omitted. Moreover, the last memory array 255CB farthest away from the common word line driver 210 can be protected by the last sub-word line driver 252CB, such that an additional protection circuit to protect the last memory array 255CB may be omitted. By omitting the additional protection circuits, an area efficiency can be achieved. Moreover, a length of the common word line WL can be reduced, such that RC loading at the common word line WL can be reduced to improve operating speed of the plurality of memory cells 125.

Figure 3:
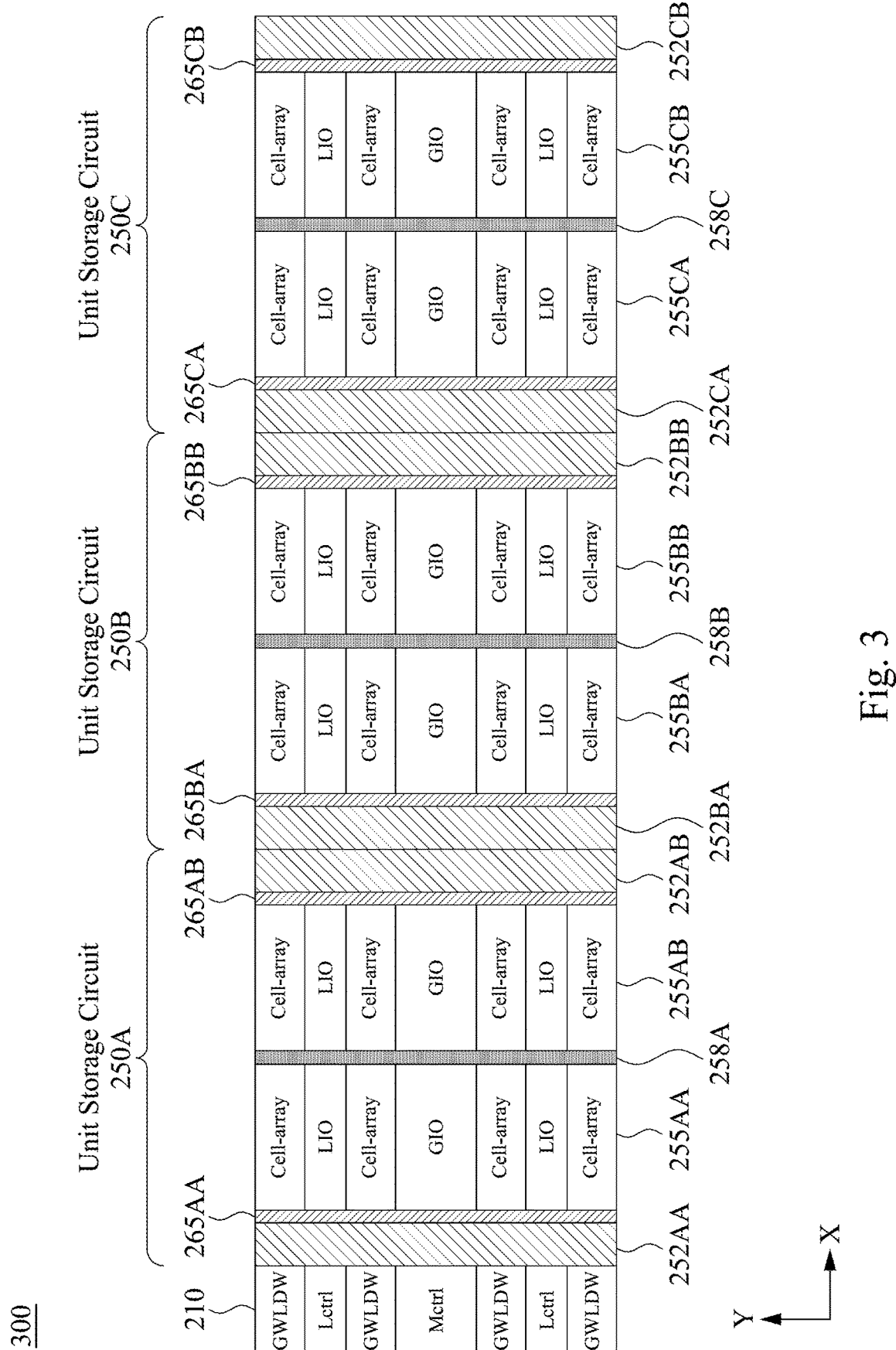
FIG. 3 is a diagram of a memory system including a common word line driver and a plurality of unit storage circuits, in accordance with one embodiment.

FIG. 3 is a diagram of a memory system 300 including the common word line driver 210 and the plurality of unit storage circuits 250A, 250B, 250C, in accordance with one embodiment. In some embodiments, the memory system 300 is embodied as the memory system 200 of FIG. 2.

In one aspect, the common word line driver 210 includes gate word line drivers (GWLDV), local control circuits (Lctrl), and a main controller (Mctrl). The gate word line drivers GWLDV, logic control circuit Lctrl, and the main controller Mctrl may be disposed along the Y-direction traversing the X-direction. In one aspect, the main controller Mctrl generates a global control signal to configure a plurality of memory cells 125. In one aspect, the logic control circuits Lctrl generate local control signals to individually control different portions of memory cells 125 separately. In one aspect, each gate word line driver GWLDV is electrically coupled to a corresponding row of memory cells 125 through a respective common word line WL. The gate word line driver GWLDV may generate a word line pulse and apply the word line pulse to the corresponding row of memory cells 125 through the common word line WL.

In one aspect, each memory array 255 includes a group of memory cells 125, local input/output interface circuits (LIO), and a global input/output interface circuit (GIO). The memory cells, local input/output interface circuits (LIO) and the global input/output interface circuit (GIO) may be disposed along the Y-direction. The local input/output interface circuit (LIO) may receive a local control signal from the local control circuit Lctrl, and configure or operate a respective portion of the group of memory cells 125 in the memory array 255 according to the local control signal. The global input/output interface circuit (GIO) may receive a global control signal from the main control circuit Mctrl and configure or operate the group of memory cells 125 in the memory array 255 according to the global control signal.

In one aspect, the memory system 300 can achieve area efficiency. For example, a group of memory cells 125 in the first memory array 255AA closest to the common word line driver 210 can be protected by the first sub-word line driver 252AA, such that an additional protection circuit to protect the group of memory cells 125 in the first memory array 255AA may be omitted. Moreover, a group of memory cells 125 in the last memory array 255CB farthest away from the common word line driver 210 can be protected by the last sub-word line driver 252CB, such that an additional protection circuit to protect a group of memory cells 125 in the last memory array 255CB may be omitted. By omitting the additional protection circuits, an area efficiency can be achieved.

Figure 4:
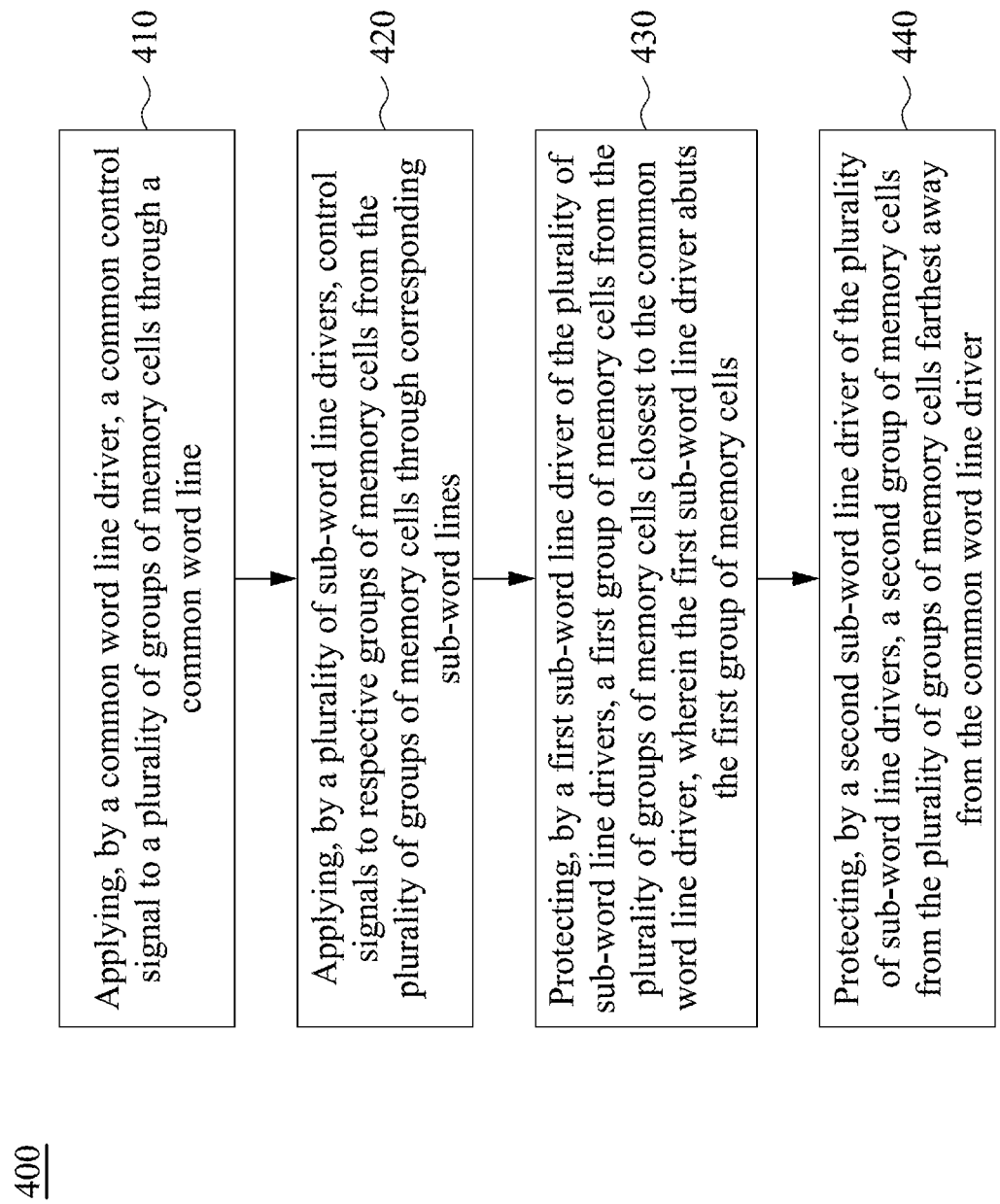
FIG. 4 is a flowchart of operating or configuring a plurality of memory cells, in accordance with some embodiments.

FIG. 4 is a flowchart of a method 400 of configuring or operating a plurality of groups of memory cells 125, in accordance with some embodiments. In some embodiments, the method 400 is performed by the common word line driver 210 and sub-word line drivers 252. In some embodiments, the method 400 is performed by other entities. In some embodiments, the method 400 includes more, fewer, or different operations than shown in FIG. 4.

In an operation 410, the common word line driver 210 applies a common control signal to a plurality of groups of memory cells 125 through a common word line WL. A plurality of groups of memory array 255 may include respective groups of memory cells 125. A first group of memory cells 125 in the first memory array 255AA from the plurality of group memory cells 125 may be disposed closest to the common word line driver 210, and a second group of memory cells 125 in the second memory array 255CB from the plurality of group memory cells 125 may be disposed farthest away from the common word line driver 210. The common word line WL may extend over the plurality of groups of memory cells 125 over a direction (e.g., X-direction).

In an operation 420, each of a plurality of sub-word line drivers 252 applies a control signal to a respective group of memory cells 125 through a corresponding sub-word line SWL. Each sub-word line SWL may be shorter than the common word line WL. The plurality of sub-word line drivers 252 may apply control signals to the respective groups of memory cells 125, while the common word line driver 210 applies the common control signal to the plurality of groups of memory cells 125.

In one example, a first sub-word line driver 252AA applies a first control signal to the first group of memory cells 125 in the first memory array 255AA. The first sub-word line driver 252AA may include a first side abutting the common word line driver 210 and a second side abutting the first group of memory cells 125 in the first memory array 255AA. The first sub-word line driver 252AA may apply the first control signal to the first group of memory cells 125 through a first sub-word line SWLAA extending over the first group of memory cells 125 in the first memory array 255AA.

In one example, a second sub-word line driver 252CB applies a second control signal to a second group of memory cells 125 in the second memory array 255CB. The second sub-word line driver 252CB may include a first side abutting the second memory array 255CB. The second sub-word line driver 252CB may be disposed farther away from the common word line driver 210 than the second memory array 255CB. The second sub-word line driver 252CB may apply the second control signal to the second group of memory cells 125 through a second sub-word line SWLCB extending over the second group of memory cells 125 in the second memory array 255CB.

In an operation 430, the sub-word line driver 252AA protects the first group of memory cells 125 in the first memory array 255AA. The sub-word line driver 252AA may include a protection circuit abutting the first memory array 255AA. The protection circuit of the sub-word line driver 252AA may protect the first group of memory cells 125 in the first memory array 255AA from being damaged, for example due to excessive voltage or current applied to the first group of memory cells 125.

In an operation 440, the sub-word line driver 252CB protects the second group of memory cells 125 in the second memory array 255CB. The sub-word line driver 252CB may include a protection circuit abutting the second memory array 255CB. The protection circuit of the sub-word line driver 252CB may protect the second group of memory cells 125 in the second memory array 255CB from being damaged, for example due to excessive voltage or current applied to the second group of memory cells 125.

Advantageously, the memory system 200 can be implemented in an area efficient manner. In one aspect, each sub-word line driver 252 may include a protection circuit to protect a corresponding group of memory cells. Hence, the first group of memory cells 125 in the first memory array 255AA closest to the common word line driver 210 can be protected by the first sub-word line driver 252AA, such that an additional protection circuit may be omitted. Moreover, the second group of memory cells 125 in the second memory array 255CB farthest away from the common word line driver 210 can be protected by the second sub-word line driver 252CB, such that an additional protection circuit may be omitted. By omitting the additional protection circuits to protect the first group of memory cells 125 and the second group of memory cells 125, an area efficiency can be achieved. Moreover, a length of the common word line WL can be reduced, such that RC loading at the common word line WL can be reduced to improve operating speed of the plurality of memory cells 125.

Figure 5:
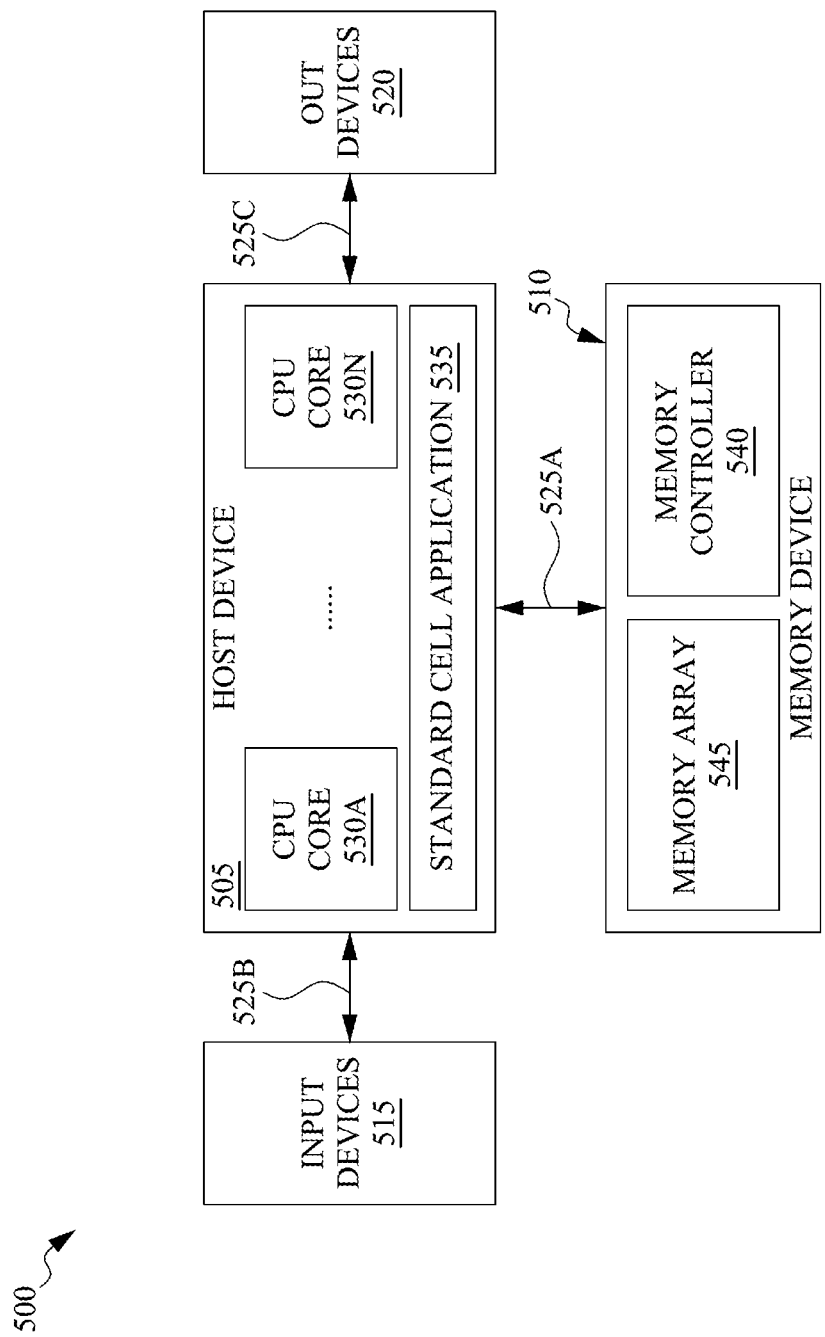
FIG. 5 is an example block diagram of a computing system, in accordance with some embodiments.

Referring now to FIG. 5, an example block diagram of a computing system 500 is shown, in accordance with some embodiments of the disclosure. The computing system 500 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 500 includes a host device 505 associated with a memory device 510. The host device 505 may be configured to receive input from one or more input devices 515 and provide output to one or more output devices 520. The host device 505 may be configured to communicate with the memory device 510, the input devices 515, and the output devices 520 via appropriate interfaces 525A, 525B, and 525C, respectively. The computing system 500 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 505.

The input devices 515 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 505 and that allows an external source, such as a user (e.g., a circuit or layout designer), to enter information (e.g., data) into the host device and send instructions to the host device. Similarly, the output devices 520 may include a variety of output technologies such as external memories, printers, speakers, displays, microphones, light emitting diodes, headphones, video devices, and any other output peripherals that are configured to receive information (e.g., data) from the host device 505. The "data" that is either input into the host device 505 and/or output from the host device may include any of a variety of textual data, circuit data, signal data, semiconductor device data, graphical data, combinations thereof, or other types of analog and/or digital data that is suitable for processing using the computing system 500.

The host device 505 includes or is associated with one or more processing units/processors, such as Central Processing Unit ("CPU") cores 530A-530N. The CPU cores 530A-530N may be implemented as an Application Specific Integrated Circuit ("ASIC"), Field Programmable Gate Array ("FPGA"), or any other type of processing unit. Each of the CPU cores 530A-530N may be configured to execute instructions for running one or more applications of the host device 505. In some embodiments, the instructions and data to run the one or more applications may be stored within the memory device 510. The host device 505 may also be configured to store the results of running the one or more applications within the memory device 510. Thus, the host device 505 may be configured to request the memory device 510 to perform a variety of operations. For example, the host device 505 may request the memory device 510 to read data, write data, update or delete data, and/or perform management or other operations. One such application that the host device 505 may be configured to run may be a standard cell application 535. The standard cell application 535 may be part of a computer aided design or electronic design automation software suite that may be used by a user of the host device 505 to use, create, or modify a standard cell of a circuit. In some embodiments, the instructions to execute or run the standard cell application 535 may be stored within the memory device 510. The standard cell application 535 may be executed by one or more of the CPU cores 530A-530N using the instructions associated with the standard cell application from the memory device 510. In one example, the standard cell application 535 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 5, the memory device 510 includes a memory controller 940 that is configured to read data from or write data to a memory array 545. The memory array 545 may include a variety of volatile and/or non-volatile memories. For example, in some embodiments, the memory array 545 may include NAND flash memory cores. In other embodiments, the memory array 545 may include NOR flash memory cores, SRAM cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 545 may be individually and independently controlled by the memory controller 540. In other words, the memory controller 540 may be configured to communicate with each memory within the memory array 545 individually and independently. By communicating with the memory array 545, the memory controller 540 may be configured to read data from or write data to the memory array in response to instructions received from the host device 505. Although shown as being part of the memory device 510, in some embodiments, the memory controller 540 may be part of the host device 505 or part of another component of the computing system 500 and associated with the memory device. The memory controller 540 may be implemented as a logic circuit in either software, hardware, firmware, or combination thereof to perform the functions described herein. For example, in some embodiments, the memory controller 540 may be configured to retrieve the instructions associated with the standard cell application 535 stored in the memory array 545 of the memory device 510 upon receiving a request from the host device 505.

It is to be understood that only some components of the computing system 500 are shown and described in FIG. 5. However, the computing system 500 may include other components such as various batteries and power sources, networking interfaces, routers, switches, external memory systems, controllers, etc. Generally speaking, the computing system 500 may include any of a variety of hardware, software, and/or firmware components that are needed or considered desirable in performing the functions described herein. Similarly, the host device 505, the input devices 515, the output devices 520, and the memory device 510 including the memory controller 540 and the memory array 545 may include other hardware, software, and/or firmware components that are considered necessary or desirable in performing the functions described herein.

One aspect of this description relates to a memory system. In some embodiments, the memory system includes a plurality of memory cells including a first group of memory cells, a second group of memory cells, and a third group of memory cells. In some embodiments, the memory system includes a common word line driver to apply a common control signal to the plurality of memory cells through a common word line extending along a direction. In some embodiments, the memory system includes a first sub-word line driver to apply a first control signal to the first group of memory cells through a first sub-word line extending along the direction. In some embodiments, the first sub-word line driver is adjacent to the common word line driver. In some embodiments, the memory system includes a second sub-word line driver to apply a second control signal to the second group of memory cells through a second sub-word line extending along the direction. In some embodiments, the memory system includes a third sub-word line driver to apply a third control signal to the third group of memory cells through a third sub-word line extending along the direction. In some embodiments, the third sub-word line driver is adjacent to the second sub-word line driver. In some embodiments, the common word line driver, the first sub-word line driver, the first group of memory cells, the second group of memory cells, the second sub-word line driver, the third sub-word line driver, and the third group of memory cells are disposed along the direction in that sequence.

One aspect of this description relates to a memory system. In some embodiments, the memory system includes a plurality of unit storage circuits, where each of the plurality of unit storage circuits abuts an adjacent one of the plurality of unit storage circuits. In some embodiments, each of the plurality of unit storage circuits includes a first group of memory cells, a second group of memory cells, a first sub-word line driver, and a second sub-word line driver. In some embodiments, the first sub-word line driver is configured to apply a first control signal to the first group of memory cells through a first sub-word line extending along a direction. In some embodiments, the second sub-word line driver is configured to apply a second control signal to the second group of memory cells through a second sub-word line extending along the direction. In some embodiments, the first sub-word line driver, the first group of memory cells, the first sub-word line driver, and the second sub-word line driver are disposed along the direction in that sequence. In some embodiments, the memory system includes a common word line driver to apply a common control signal to the plurality of unit storage circuits through a common word line extending along the direction. In some embodiments, the common word line driver abuts one of the plurality of unit storage circuits.

One aspect of this description relates to a method of operating a memory system. In some embodiments, the method includes applying, by a common word line driver, a common control signal to a plurality of groups of memory cells through a common word line. In some embodiments, the method includes applying, by a plurality of sub-word line drivers, control signals to respective groups of memory cells from the plurality of groups of memory cells through corresponding sub-word lines. In some embodiments, the method includes protecting, by a first sub-word line driver of the plurality of sub-word line drivers, a first group of memory cells from the plurality of groups of memory cells closest to the common word line driver. In some embodiments, the first sub-word line driver abuts the first group of memory cells. In some embodiments, the method includes protecting, by a second sub-word line driver of the plurality of sub-word line drivers, a second group of memory cells from the plurality of groups of memory cells farthest away from the common word line driver.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system comprising:
   a first group of memory cells;
   a second group of memory cells;
   a first sub-word line driver abutted to the first group of memory cells, wherein the first sub-word line driver is configured to apply a first control signal to the first group of memory cells; and
   a second sub-word line driver abutted to the second group of memory cells, wherein the second sub-word line driver is configured to apply a second control signal to the second group of memory cells;
   wherein the first group of memory cells, the first sub-word line driver, the second sub-word line driver, and the second group of memory cells are disposed next to one another in such a sequence along a lateral direction.

2. The memory system of claim 1, further comprising a common word line driver to apply a common control signal to at least the first group of memory cells and the second group of memory cells through a common word line extending along the lateral direction.

3. The memory system of claim 2, further comprising:
   a third group of memory cells; and
   a third sub-word line driver abutted to the third group of memory cells, and configured to apply a third control signal to the third group of memory cells;
   wherein the third sub-word line driver is disposed opposite the third group of memory cells from the first group of memory cells along the lateral direction.

4. The memory system of claim 3, wherein the common word line driver is disposed opposite the third sub-word line driver from the third group of memory cells along the lateral direction.

5. The memory system of claim 3, further comprising:
   a word line strap disposed between the first group of memory cells and the third group of memory cells.

6. The memory system of claim 5, further comprising:
   a first sub-word line configured to electrically couple the first sub-word line driver to the first group of memory cells; and a third sub-word line configured to electrically couple the third sub-word line driver to the third group of memory cells.

7. The memory system of claim 6, wherein the word line strap is configured to electrically decouple the first sub-word line from the third sub-word line.

8. The memory system of claim 6, wherein each of the first sub-word line and the third sub-word line is shorter than the common word line.

9. The memory system of claim 1, wherein the first sub-word line driver includes a first interface circuit abutting the first group of memory cells, wherein the first interface circuit is configured to protect the first group of memory cells.

10. The memory system of claim 9, wherein the second sub-word line driver includes a second interface circuit abutting the second group of memory cells, wherein the second interface circuit is configured to protect the second group of memory cells.

11. A memory system comprising:
a plurality of memory cells including a first group of memory cells, a second group of memory cells, a third group of memory cells, and a fourth group of memory cells;
a first sub-word line driver configured to apply a first control signal to the first group of memory cells;
a second sub-word line driver configured to apply a second control signal to the second group of memory cells;
a third sub-word line driver to apply a third control signal to the third group of memory cells; and
a fourth sub-word line driver to apply a fourth control signal to the fourth group of memory cells;
wherein the first sub-word line driver, the first group of memory cells, the second group of memory cells, the second sub-word line driver, the third sub-word line driver, the third group of memory cells, the fourth group of memory cells, and the fourth sub-word line driver are disposed next to one another in such a sequence along a lateral direction.

12. The memory system of claim 11, further comprising a common word line driver to apply a common control signal to plurality of memory cells through a common word line extending along the lateral direction.

13. The memory system of claim 12, wherein the common word line driver is disposed opposite the first sub-word line driver from the first group of memory cells along the lateral direction.

14. The memory system of claim 13, further comprising:
a first word line strap disposed between the first group of memory cells and the second group of memory cells; and
a second word line strap disposed between the third group of memory cells and the fourth group of memory cells.

15. The memory system of claim 14, further comprising:
a first sub-word line configured to electrically couple the first sub-word line driver to the first group of memory cells;
a second sub-word line configured to electrically couple the second sub-word line driver to the second group of memory cells;
a third sub-word line configured to electrically couple the third sub-word line driver to the third group of memory cells; and a fourth sub-word line configured to electrically couple the fourth sub-word line driver to the fourth group of memory cells.

16. The memory system of claim 15, wherein each of the first to fourth sub-word lines is shorter than the common word line.

17. The memory system of claim 11, wherein the first sub-word line driver includes a first interface circuit configured to protect the first group of memory cells and abutting the first group of memory cells, the second sub-word line driver includes a second interface circuit configured to protect the second group of memory cells and abutting the second group of memory cells, the third sub-word line driver includes a third interface circuit configured to protect the third group of memory cells and abutting the third group of memory cells, and the fourth sub-word line driver includes a fourth interface circuit configured to protect the fourth group of memory cells and abutting the fourth group of memory cells.

18. A memory system, comprising:
a plurality of memory cells including a first group of memory cells, a second group of memory cells, a third group of memory cells, and a fourth group of memory cells;
a common word line driver configured to apply a common control signal to the plurality of memory cells;
a first sub-word line driver configured to apply a first control signal to the first group of memory cells;
a second sub-word line driver configured to apply a second control signal to the second group of memory cells;
a third sub-word line driver to apply a third control signal to the third group of memory cells; and
a fourth sub-word line driver to apply a fourth control signal to the fourth group of memory cells;
wherein the common word line driver, the first sub-word line driver, the first group of memory cells, the second group of memory cells, the second sub-word line driver, the third sub-word line driver, the third group of memory cells, the fourth group of memory cells, and the fourth sub-word line driver are disposed next to one another in such a sequence along a lateral direction.

19. The memory system of claim 18, further comprising:
a first word line strap disposed between the first group of memory cells and the second group of memory cells; and
a second word line strap disposed between the third group of memory cells and the fourth group of memory cells.

20. The memory system of claim 18, wherein the first sub-word line driver includes a first interface circuit configured to protect the first group of memory cells and abutting the first group of memory cells, the second sub-word line driver includes a second interface circuit configured to protect the second group of memory cells and abutting the second group of memory cells, the third sub-word line driver includes a third interface circuit configured to protect the third group of memory cells and abutting the third group of memory cells, and the fourth sub-word line driver includes a fourth interface circuit configured to protect the fourth group of memory cells and abutting the fourth group of memory cells.

* * * * *